US012581884B2

(12) United States Patent
Jo et al.

(10) Patent No.: US 12,581,884 B2
(45) Date of Patent: Mar. 17, 2026

(54) METHODS FOR OXIDIZING A SILICON HARDMASK USING ION IMPLANT

(71) Applicant: Applied Materials, Inc., Santa Clara, CA (US)

(72) Inventors: Sungho Jo, Brookline, MA (US); Rajesh Prasad, Lexington, MA (US); Kyuha Shim, Andover, MA (US)

(73) Assignee: Applied Materials, Inc., Santa Clara, CA (US)

( * ) Notice: Subject to any disclaimer, the term of this patent is extended or adjusted under 35 U.S.C. 154(b) by 668 days.

(21) Appl. No.: 17/703,254

(22) Filed: Mar. 24, 2022

(65) Prior Publication Data

US 2023/0268188 A1     Aug. 24, 2023

Related U.S. Application Data

(60) Provisional application No. 63/312,163, filed on Feb. 21, 2022.

(51) Int. Cl.
*H01L 21/308* (2006.01)
*H01L 21/02* (2006.01)
*H01L 21/265* (2006.01)

(52) U.S. Cl.
CPC .... *H01L 21/3086* (2013.01); *H01L 21/02164* (2013.01); *H01L 21/02238* (2013.01); *H01L 21/02252* (2013.01); *H01L 21/26533* (2013.01); *H01L 21/3081* (2013.01)

(58) Field of Classification Search
CPC ........... H01L 21/3086; H01L 21/02164; H01L 21/02238; H01L 21/26533; H01L 21/3081; H01L 21/02252; H01L 21/02315; H01L 21/266; H01L 21/0332–0337
See application file for complete search history.

(56) References Cited

U.S. PATENT DOCUMENTS

2002/0001972 A1*   1/2002   Pearce ............ H01L 21/823462
                                                                    438/258
2013/0164919 A1*   6/2013   Park ................... H01L 29/4966
                                                                    257/E21.24

FOREIGN PATENT DOCUMENTS

JP          2003297928       * 10/2003

OTHER PUBLICATIONS

JP 2003297928 machine translation by Espacenet (Year: 2003).*

* cited by examiner

*Primary Examiner* — Evan G Clinton
*Assistant Examiner* — Corbyn D Mellinger
(74) *Attorney, Agent, or Firm* — KDW Firm PLLC

(57) ABSTRACT

Methods of forming a silicon hardmask are disclosed. In one example, a method may include forming a silicon mask over a device layer, forming a carbon mask over the silicon mask, and forming an opening through the carbon mask. The method may further include forming an oxide layer within the opening by performing an ion implantation process to an upper surface of the silicon mask.

17 Claims, 4 Drawing Sheets

METHODS FOR OXIDIZING A SILICON HARDMASK USING ION IMPLANT

RELATED APPLICATION

This application claims priority to U.S. provisional patent application Ser. No. 63/312,163, filed on Feb. 21, 2022, entitled "METHODS FOR OXIDIZING A SILICON HARDMASK USING ION IMPLANT," which is incorporated herein by reference in its entirety.

FIELD OF THE DISCLOSURE

The present disclosure generally relates to processing of logic and memory devices. More specifically, the disclosure relates to methods of oxidizing a silicon hardmask using an ion implant.

BACKGROUND OF THE DISCLOSURE

Conventional silicon hardmask patterning processes require carbon/(nitride/oxide)/silicon hardmask depositions and carbon/(nitride/oxide) hardmask etchings before silicone etching. However, each hardmask etching process contributes to line edge roughness (LER) and/or line width roughness (LWR).

Accordingly, improved methods and related equipment are needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include providing a silicon mask over a device layer, providing a carbon mask over the silicon mask, and forming an opening through the carbon mask. The method may further include forming an oxide layer within the opening by performing an ion implantation process to an upper surface of the silicon mask.

In another aspect, a method may include forming a silicon hardmask over a device layer, forming a carbon hardmask over the silicon hardmask, and forming an opening through the carbon hardmask. The method may further include forming an oxide layer within the opening by performing an ion implantation process to an upper surface of the silicon hardmask.

In yet another aspect, a method of forming an oxide layer may include forming a silicon hardmask over a device layer, forming a carbon hardmask over the silicon hardmask, and forming an opening through the carbon hardmask, wherein the opening is formed selective to an upper surface of the silicon hardmask. The method may further include forming an oxide layer along the upper surface of the silicon hardmask left exposed within the opening by directing ions into the upper surface of the silicon hardmask.

BRIEF DESCRIPTION OF THE DRAWINGS

The accompanying drawings illustrate exemplary approaches of the disclosure, including the practical application of the principles thereof, as follows.

Figure 1:
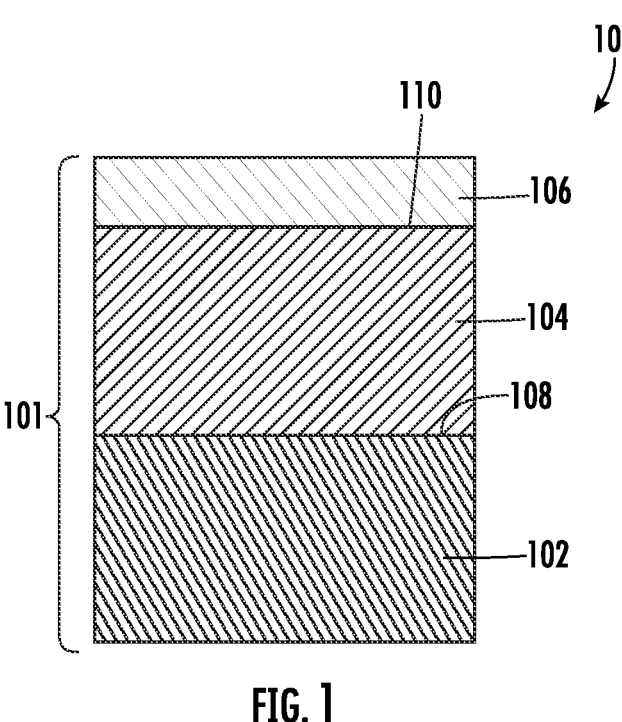
FIG. 1 is a side cross-sectional view of a stack of layers of a device, according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Apparatuses, systems, and methods in accordance with the present disclosure will now be described more fully hereinafter with reference to the accompanying drawings, where various embodiments are shown. The apparatuses, systems, methods may be embodied in many different forms and are not to be construed as being limited to the embodiments set forth herein. Instead, these embodiments are provided so the disclosure will be thorough and complete, and will fully convey the scope of the apparatuses, systems, and methods to those skilled in the art.

Instead of forming a hardmask of nitride/oxide by deposition and etching, in the present disclosure, an oxide hardmask may be directly formed on a silicon mask at an opening of a carbon mask, by either ion implantation-enhanced oxidation or by ion implantation-induced oxidation. By avoiding the conventional, intermediate hardmask of the prior art, LER and LWR may be improved.

FIG. 1 is a side cross-sectional view of a device 100, such as semiconductor or logic device, according to embodiments of the present disclosure. The device 100 may include a stack of layers 101, such as a device layer 102 (e.g., interlayer, substrate, etc.), a silicon layer or mask 104 (e.g., hardmask), and an upper layer or mask 106 (e.g., carbon hardmask). Although described herein as formed from carbon, it will be appreciated that the upper mask 106 may be formed with one or more different materials in other embodiments. As shown, the silicon mask 104 may be formed directly atop an upper surface 108 of the device layer 102, and the carbon mask 106 may be formed directly atop an upper layer or surface 110 of the silicon mask 104.

Figure 2:
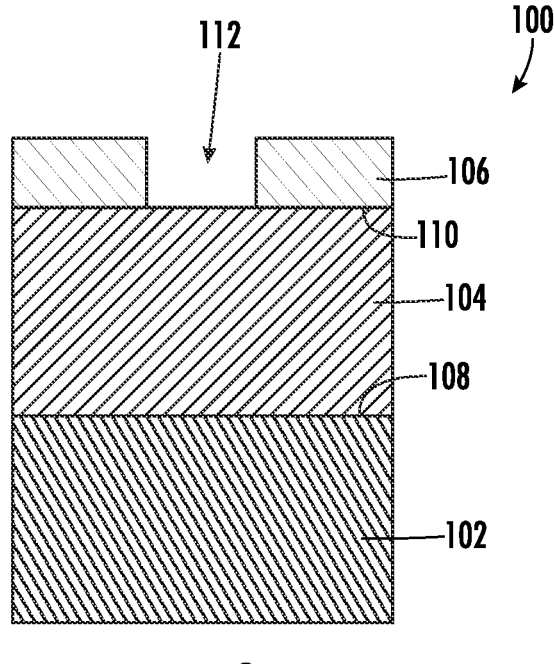
FIG. 2 is a side cross-sectional view of the device following formation of an opening through a carbon mask of the stack of layers, according to embodiments of the present disclosure.

As shown in FIG. 2, an opening 112 may be formed (e.g., etched) through the carbon mask 106 to expose a portion of the upper surface 110 of the silicon mask 104. In some embodiments, the carbon mask 106 may be etched selective to the upper surface 110 of the silicone mask 104.

Figures 3, 4:
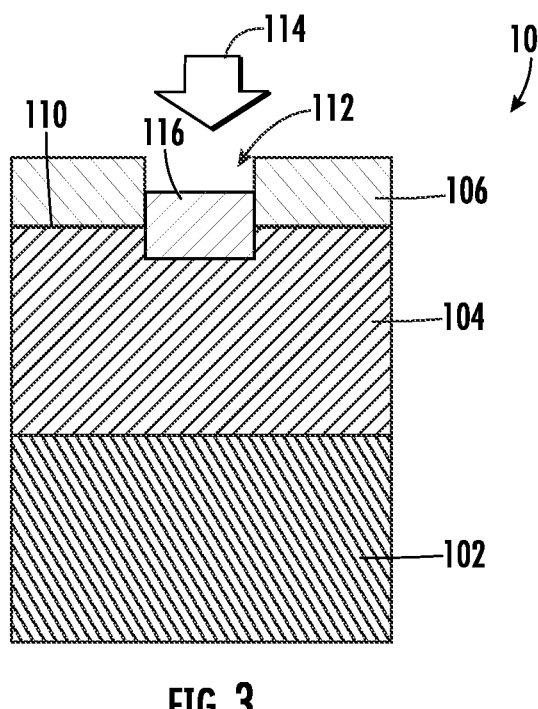
FIG. 3 is a side cross-sectional view of the device following formation of an oxide layer, according to embodiments of the present disclosure.
FIG. 4 is a side cross-sectional view of the device following removal of the carbon mask, according to embodiments of the present disclosure.

As shown in FIG. 3, an ion implantation process 114 may then be performed at room temperature, cold temperatures, or hot temperatures to the device 100 to form an oxide layer 116 within the opening 112 of the carbon mask 106. As shown, the oxide layer 116 may extend entirely across a width of the opening 112. In some embodiments, the oxide layer 116 may extend into the silicon mask 104. In still other embodiments, the oxide layer 116 may also extend partially above a plane defined by the upper surface 110 of the silicon mask 104. The oxide layer 116 may be formed by an ion implantation-enhanced oxidation process in which ions (e.g., boron, silicon, and/or fluorine) are directed into the upper surface 110 of the silicon mask 104 left uncovered by the carbon mask 106, followed by an oxidation scheme (e.g., thermal oxidation or oxide deposition). The ion species may be selected to retard oxidation of the carbon mask 106. In various embodiments, the ion implantation may be done at room temperature, cold temperatures, or hot temperatures to control implant damage, and In another embodiment, the oxide layer 116 may be formed by an ion implantation-induced oxidation process in which high-dose oxygen ions are implanted directly into the upper surface 110 of the silicon mask 104. The oxygen ion implantation may be done at room temperature, cold temperatures, or hot temperatures to control implant damage.

Figure 5:
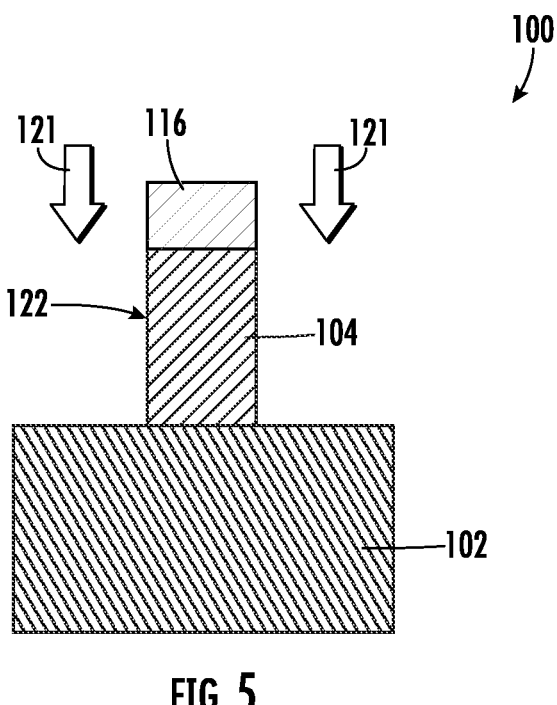
FIG. 5 is a side cross-sectional view of the device following an etch to a silicon mask of the stack of layers, according to embodiments of the present disclosure.

As shown in FIG. 4, the carbon mask 106 may then be removed selective to the upper surface 110 of the silicon mask 104. In some embodiments, the carbon mask 106 may be removed using an etch process, which has no, or minimal, impact to the oxide layer 116. The device 100 may then be processed (e.g., etched 121) to remove portions of the silicon mask 104 left uncovered by the oxide layer 116, as shown in FIG. 5. In some embodiments, a fin or pillar structure 122 may be formed following the etching 121. It will be appreciated that while only a single pillar structure 122 is shown, multiple pillar structures 122 and oxide layers 116 may be present in other embodiments.

Figure 6:
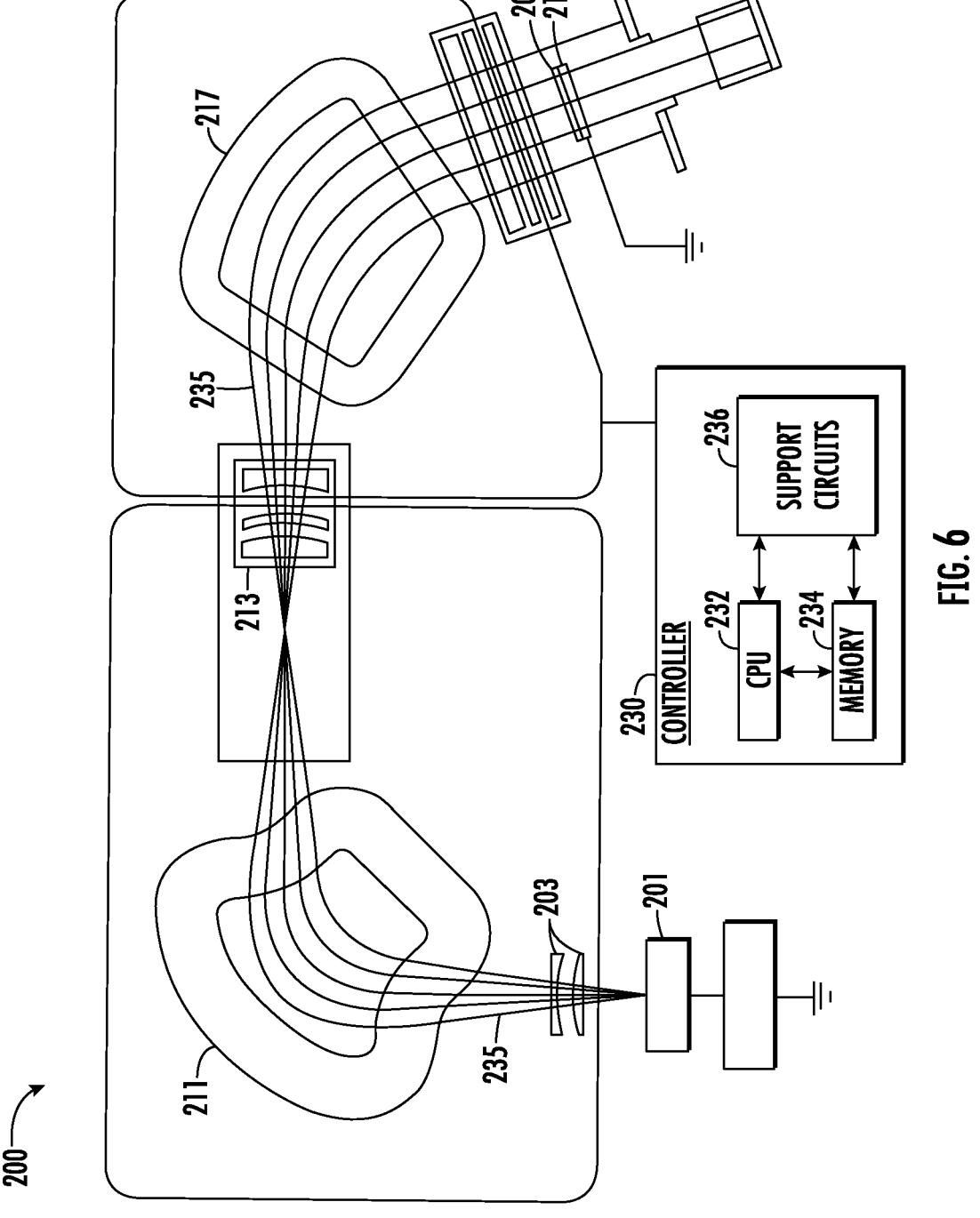
FIG. 6 illustrates a schematic diagram of a processing apparatus according to embodiments of the present disclosure.

FIG. 6 illustrates a schematic diagram of a processing apparatus 200 useful to perform processes described herein. One example of a beam-line ion implantation processing apparatus is the Varian VIISTA® Trident, available from Applied Materials Inc., Santa Clara, Calif. The processing apparatus 200 may include an ion source 201 for generating ions. For example, the ion source 201 may provide an ion implant, such as the ion implantation process 114 demonstrated in FIG. 3. The ion source 201 may also provide an ion etch, such as etching 121 demonstrated in FIG. 5. The processing apparatus 200 may also include a series of beam-line components. Examples of beam-line components may include extraction electrodes 203, a magnetic mass analyzer 211, a plurality of lenses 213, and a beam parallelizer 217. The processing apparatus 200 may also include a platen 219 for supporting a substrate 202 to be processed. The substrate 202 may be the same or different as the device layer 102 described above. The substrate 202 may be moved in one or more dimensions (e.g. translate, rotate, tilt, etc.) by a component sometimes referred to as a "roplat" (not shown). It is also contemplated that the processing apparatus 200 may be configured to perform heated implantation processes to provide for improved control of implantation characteristics, such as the ion trajectory and implantation energy utilized to dope the substrate.

In operation, ions of the desired species, for example, dopant ions, are generated and extracted from the ion source 201. Thereafter, the extracted ions 235 travel in a beam-like state along the beam-line components and may be implanted in the substrate 202. Similar to a series of optical lenses that manipulate a light beam, the beam-line components manipulate the extracted ions 235 along the ion beam. In such a manner, the extracted ions 235 are manipulated by the beam-line components while the extracted ions 235 are directed toward the substrate 202. It is contemplated that the apparatus 200 may provide for improved mass selection to implant desired ions while reducing the probability of undesirable ions (impurities) being implanted in the substrate 202.

In some embodiments, the processing apparatus 200 can be controlled by a processor-based system controller such as controller 230. For example, the controller 230 may be configured to control beam-line components and processing parameters associated with beam-line ion implantation processes. The controller 230 may include a programmable central processing unit (CPU) 232 that is operable with a memory 234 and a mass storage device, an input control unit, and a display unit (not shown), such as power supplies, clocks, cache, input/output (I/O) circuits, and the like, coupled to the various components of the processing apparatus 200 to facilitate control of the substrate processing. The controller 230 also includes hardware for monitoring substrate processing through sensors in the processing apparatus 200, including sensors monitoring the substrate position and sensors configured to receive feedback from and control a heating apparatus coupled to the processing apparatus 200. Other sensors that measure system parameters such as substrate temperature and the like, may also provide information to the controller 230.

To facilitate control of the processing apparatus 200 described above, the CPU 232 may be one of any form of general-purpose computer processor that can be used in an industrial setting, such as a programmable logic controller (PLC), for controlling various chambers and sub-processors. The memory 234 is coupled to the CPU 232 and the memory 234 is non-transitory and may be one or more of readily available memory such as random access memory (RAM), read only memory (ROM), floppy disk drive, hard disk, or any other form of digital storage, local or remote. Support circuits 236 may be coupled to the CPU 232 for supporting the processor in a conventional manner. Implantation and other processes are generally stored in the memory 234, typically as a software routine. The software routine may also be stored and/or executed by a second CPU (not shown) that is remotely located from the hardware being controlled by the CPU 232.

The memory 234 is in the form of computer-readable storage media that contains instructions, that when executed by the CPU 232, facilitates the operation of the apparatus 200. The instructions in the memory 234 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the device 100, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
providing a silicon hardmask over a device layer;
providing a carbon hardmask over the silicon hardmask;
forming an opening through the carbon hardmask;
forming an oxide layer within the opening by performing an ion implantation process to an upper surface of the silicon hardmask, wherein the ion implantation process comprises directing ions into the upper surface of the silicon hardmask left uncovered by the carbon hardmask, wherein the ions are selected from a species configured to retard oxidation of the carbon hardmask;
removing the carbon hardmask; and
etching the silicon hardmask left uncovered by the oxide layer to form a plurality of hardmask patterning lines over the device layer.

2. The method of claim 1, wherein the silicon hardmask is etched selective to an upper surface of the device layer.

3. The method of claim 1, wherein the silicon hardmask is formed directly atop the device layer, and wherein the carbon hardmask is formed directly atop the silicon hardmask.

4. The method of claim 1, wherein forming the opening through the carbon hardmask comprises etching the carbon hardmask selective to the upper surface of the silicon hardmask.

5. The method of claim 1, wherein the ion implantation process forms the oxide layer to a height above a plane defined by a bottom surface of the carbon hardmask, and wherein the ion implantation process further comprises:

oxidizing the upper surface of the silicon hardmask left uncovered by the carbon hardmask.

6. The method of claim 5, wherein the ions are at least one of:

boron, silicon, and fluorine.

7. The method of claim 1, wherein the ion implantation process comprises directing oxygen ions into the upper surface of the silicon hardmask left uncovered by the carbon hardmask.

8. The method of claim 1, wherein forming the oxide layer within the opening further comprises forming the oxide layer within the silicon hardmask.

9. A method of forming an oxide layer, comprising:

forming a silicon hardmask over a device layer;

forming a carbon hardmask over the silicon hardmask;

forming an opening through the carbon hardmask;

forming an oxide layer within the opening by performing an ion implantation process to an upper surface of the silicon hardmask, wherein the ion implantation process comprises directing ions into the upper surface of the silicon hardmask left uncovered by the carbon hardmask, wherein the ions are selected from a species configured to retard oxidation of the carbon hardmask;

removing the carbon hardmask; and etching the silicon hardmask left uncovered by the oxide layer to form a plurality of hardmask patterning lines over the device layer.

10. The method of claim 9, wherein the silicon hardmask is etched selective to an upper surface of the device layer.

11. The method of claim 9, wherein the silicon hardmask is formed directly atop the device layer, and wherein the carbon hardmask is formed directly atop the silicon hardmask.

12. The method of claim 9, wherein forming the opening through the carbon hardmask comprises etching the carbon hardmask selective to the upper surface of the silicon hardmask.

13. The method of claim 9, wherein the ion implantation process forms the oxide layer to a height above a plane defined by a bottom surface of the carbon hardmask, and wherein the implantation process further comprises:

oxidizing the upper surface of the silicon hardmask left uncovered by the carbon hardmask.

14. The method of claim 13, wherein the ions are at least one of:

boron, silicon, and fluorine.

15. The method of claim 9, wherein the ion implantation process comprises directing oxygen ions into the upper surface of the silicon hardmask left uncovered by the carbon hardmask.

16. The method of claim 9, wherein forming the oxide layer within the opening further comprises forming the oxide layer within the silicon hardmask.

17. A method of forming an oxide layer, comprising:

forming a silicon hardmask over a device layer;

forming a carbon hardmask over the silicon hardmask;

forming an opening through the carbon hardmask, wherein the opening is formed selective to an upper surface of the silicon hardmask;

forming an oxide layer along the upper surface of the silicon hardmask left exposed within the opening by directing ions into the upper surface of the silicon hardmask, wherein the ions are selected from a species configured to retard oxidation of the carbon hardmask, and wherein the oxide layer is formed to a height above a plane defined by a bottom surface of the carbon hardmask as a result of the ions being directed into the upper surface of the silicon hardmask;

removing the carbon hardmask; and etching the silicon hardmask left uncovered by the oxide layer to form a plurality of hardmask patterning lines over the device layer.

* * * * *